United States Patent
Tsai et al.

(10) Patent No.: US 8,233,583 B2
(45) Date of Patent: Jul. 31, 2012

(54) SHIFT REGISTER AND DISPLAY DRIVER THEREOF

(75) Inventors: Cheng-Hung Tsai, Changhua County (TW); Yi-Feng Liao, Taichung (TW); Chun-Yuan Hsu, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 940 days.

(21) Appl. No.: 12/264,244

(22) Filed: Nov. 3, 2008

(65) Prior Publication Data

US 2009/0231315 A1 Sep. 17, 2009

(30) Foreign Application Priority Data

Mar. 13, 2008 (TW) .............................. 97108892 A

(51) Int. Cl.
*G11C 19/00* (2006.01)
(52) U.S. Cl. ................ 377/64; 377/78; 377/79
(58) Field of Classification Search .................. None
See application file for complete search history.

(56) References Cited

U.S. PATENT DOCUMENTS

| | | | | |
|---|---|---|---|---|
| 7,831,010 | B2 * | 11/2010 | Tobita | 377/64 |
| 2005/0057481 | A1 | 3/2005 | Chung | |
| 2008/0279327 | A1 * | 11/2008 | Liu et al. | 377/64 |
| 2011/0135050 | A1 * | 6/2011 | Liu | 377/78 |

* cited by examiner

*Primary Examiner* — Tuan T Lam
(74) *Attorney, Agent, or Firm* — Jianq Chyun IP Office

(57) ABSTRACT

A shift register and a display driver thereof are provided. The display driver submitted by the present invention can be directly disposed on a glass substrate of a liquid crystal display (LCD) panel to replace a scan driver commonly used in prior art, so that the cost of the liquid crystal display can be reduced. In addition, the stress taken by the output stage transistor of each shift register stage within the display driver submitted by the present invention can be reduced. Thus, each shift register stage has the highest reliability, and may consequently avoid the erroneous actions when each shift register stage is operated for a long time.

16 Claims, 7 Drawing Sheets

SHIFT REGISTER AND DISPLAY DRIVER THEREOF

CROSS-REFERENCE TO RELATED APPLICATION

This application claims the priority benefit of Taiwan application serial no. 97108892, filed on Mar. 13, 2008. The entirety of the above-mentioned patent application is hereby incorporated by reference herein and made a part of this specification.

BACKGROUND OF THE INVENTION

1. Field of the Invention

The present invention relates to a flat panel display technique. More particularly, the present invention relates to a shift register, and a display driver using the same.

2. Description of Related Art

Recently, with a booming development of semiconductor techniques, portable electronic products and flat panel displays are developed. In various flat panel displays, the liquid crystal display (LCD) becomes popular in the market due to its advantages of low voltage operation, no radiation scattering, light-weight and small-size etc. Accordingly, miniaturization and low cost of the LCD are general trends in development of the LCD. To reduce a fabrication cost of the LCD, a method of directly fabricating multi-stage shift registers on a glass substrate via thin film transistors (TFTs) is provided by some manufactures, so as to replace a scan driver commonly used in prior art, so that the cost of the liquid crystal display can be reduced.

FIG. 1 is a circuit diagram illustrating a conventional 3-stage shift register directly fabricated on a glass substrate. FIG. 2 is a diagram illustrating operation timings and voltage simulations of a 3-stage shift register of FIG. 1. To clearly describe defects of each shift register stage, a transistor Q1, a start pulse STV, clock signals CK1~CK3, a gate low-level voltage $V_{GL}$, and output nodes OUT1~OUT3 are designated in FIG. 1.

Referring to FIG. 1 and FIG. 2, a shift register 100 may shift a data bit from a previous shift register to a next register within one clock cycle according to three clock signals CK1~CK3 respectively having 120 degrees phase differences there between. Generally, when the output node OUT1 has a high level, it represents the next shift register receives the high level, and now a gate of the transistor Q1 has to be low level, and therefore the transistor Q1 is in a turned-off state. However, when the output node OUT1 has a low level, the gate of the transistor Q1 has to be the high level, and therefore the transistor Q1 is in a turned-on state.

Accordingly, the transistor Q1 of each shift register stage is turned on for ⅔ of a total time. Moreover, number of stages of a general shift register has to be matched with a resolution of the LCD panel. Therefore, the turning on time for the transistor Q1 of each shift register stage is prolonged, and therefore a stress taken by the transistor Q1 of each shift register stage is enormously great. Moreover, FIG. 3 is a diagram illustrating current-voltage curves of a thin-film transistor when a gate thereof is under a high voltage. Referring to FIG. 3, it is obvious that the longer the stress being exerted to the transistor Q1, the greater the gate voltage is required for turning on the transistor Q1. Therefore, when such type of the shift register is directly fabricated on the glass substrate to replace the scan driver commonly used in prior art, reliability thereof is doubtable, and therefore actual application of such technique for a mass production cannot be implemented.

SUMMARY OF THE INVENTION

Accordingly, the present invention is directed to a shift register, which may reduce a stress of an output stage transistor thereof, so as to improve a reliability of the shift register.

The present invention is directed to a display driver, by serially connecting the aforementioned shift registers in multi stages, and directly fabricating the multi-stage shift registers on a glass substrate, a scan driver commonly used in prior art then may be replaced, and accordingly the cost of a liquid crystal display (LCD) can be reduced.

The present invention is directed to an LCD panel having the aforementioned display driver, and an LCD having such LCD panel, wherein the LCD panel is fabricated based on an amorphous silicon or a poly silicon process.

The present invention provides a shift register including a first to a fourth unilateral conductive devices and a first to a seventh switches. Wherein, signals received by the first to the fourth unilateral conductive device are all transmitted from first terminals to second terminals thereof. Second terminals of the first to the sixth switches receive a gate low-level voltage. The second terminal of the first unilateral conductive device is coupled to control terminals of the fifth and the seventh switches, and coupled to a first terminal of the first switch. The second terminal of the second unilateral conductive device is coupled to control terminals of the first and the third switches, and coupled to a first terminal of the second switch. The second terminal of the third unilateral conductive device is coupled to a control terminal of the fourth switch. The second terminal of the fourth unilateral conductive device is coupled to a first terminal of the fifth switch and a control terminal of the sixth switch. First terminals of the third, the fourth and the sixth switches are coupled to a second terminal of the seventh switch. A control terminal of the second switch is coupled to the first terminal of the first unilateral conductive device. A first terminal of the seventh switch is coupled to the first terminal of the fourth unilateral conductive device.

In an embodiment of the present invention, the shift register further includes an eighth switch and a ninth switch. Wherein, a first terminal of the eighth switch is coupled to the first terminal of the seventh switch. A control terminal of the eighth switch is coupled to the control terminal of the seventh switch. A first terminal of the ninth switch is coupled to a second terminal of the eighth switch, and a second terminal of the ninth switch receives the gate low-level voltage. A control terminal of the ninth switch is coupled to the control terminal of the sixth switch.

In an embodiment of the present invention, the first unilateral conductive device includes an N-type transistor. A gate of the N-type transistor is coupled to a first source/drain thereof and functions as the first terminal of the first unilateral conductive device, and a second source/drain of the N-type transistor functions as the second terminal of the first unilateral conductive device.

In an embodiment of the present invention, the second to the fourth unilateral conductive devices respectively include a first N-type transistor and a second N-type transistor. A gate of the first N-type transistor is coupled to a first source/drain thereof. A gate of the second N-type transistor is coupled to a second source/drain of the first N-type transistor, and a first source/drain of the second N-type transistor is coupled to the first source/drain of the first N-type transistor. The gates and the first sources/drains of the first N-type transistors and the first sources/drains of the second N-type transistors function as the first terminals of the second to the fourth unilateral conductive devices, and the second sources/drains of the second N-type transistors function as the second terminal of the second to the fourth unilateral conductive devices.

In an embodiment of the present invention, the seventh switch includes a first N-type transistor and a second N-type transistor. Wherein, a gate of the second N-type transistor is coupled to a gate of the first N-type transistor. A first source/drain of the second N-type transistor is coupled to a second source/drain of the first N-type transistor. A second source/drain of the second N-type transistor functions as the second terminal of the seventh switch. The gates of the first and the second N-type transistors function as the control terminal of the seventh switch. The first source/drain of the first N-type transistor functions as the first terminal of the seventh switch.

In an embodiment of the present invention, the first to the sixth switches are N-type transistors, and gates thereof function as the control terminals of the first to the sixth switches, first sources/drains thereof function as the first terminals of the first to the sixth switches, and second sources/drains thereof function as the second terminals of the first to the sixth switches.

In an embodiment of the present invention, the first terminal of the first unilateral conductive device is used for receiving a start pulse or an output data of a previous shift register stage, and the first terminals of the second to the fourth unilateral conductive devices are used for correspondingly receiving three clock signals having phase differences there between.

According to the coupling relations of the aforementioned devices and the corresponding received signals, the shift register provided by the present invention may reduce a stress taken by the output stage transistor thereof (i.e. the aforementioned sixth switch), so as to improve a reliability of the shift register. Therefore, erroneous actions of the shift register may be avoided during long time operation thereof. Moreover, since the LCD panel provided by the present invention is fabricated based on the amorphous silicon or the poly silicon process, the display driver may not only be easily fabricated on the glass substrate of the LCD panel, but may also replace a utilization of the conventional scan driver. Accordingly, fabrication cost of the LCD provided by the present invention may be reduced while application of the scan driver is omitted.

In order to make the aforementioned and other objects, features and advantages of the present invention comprehensible, a preferred embodiment accompanied with figures is described in detail below.

DESCRIPTION OF EMBODIMENTS

Figure 4:
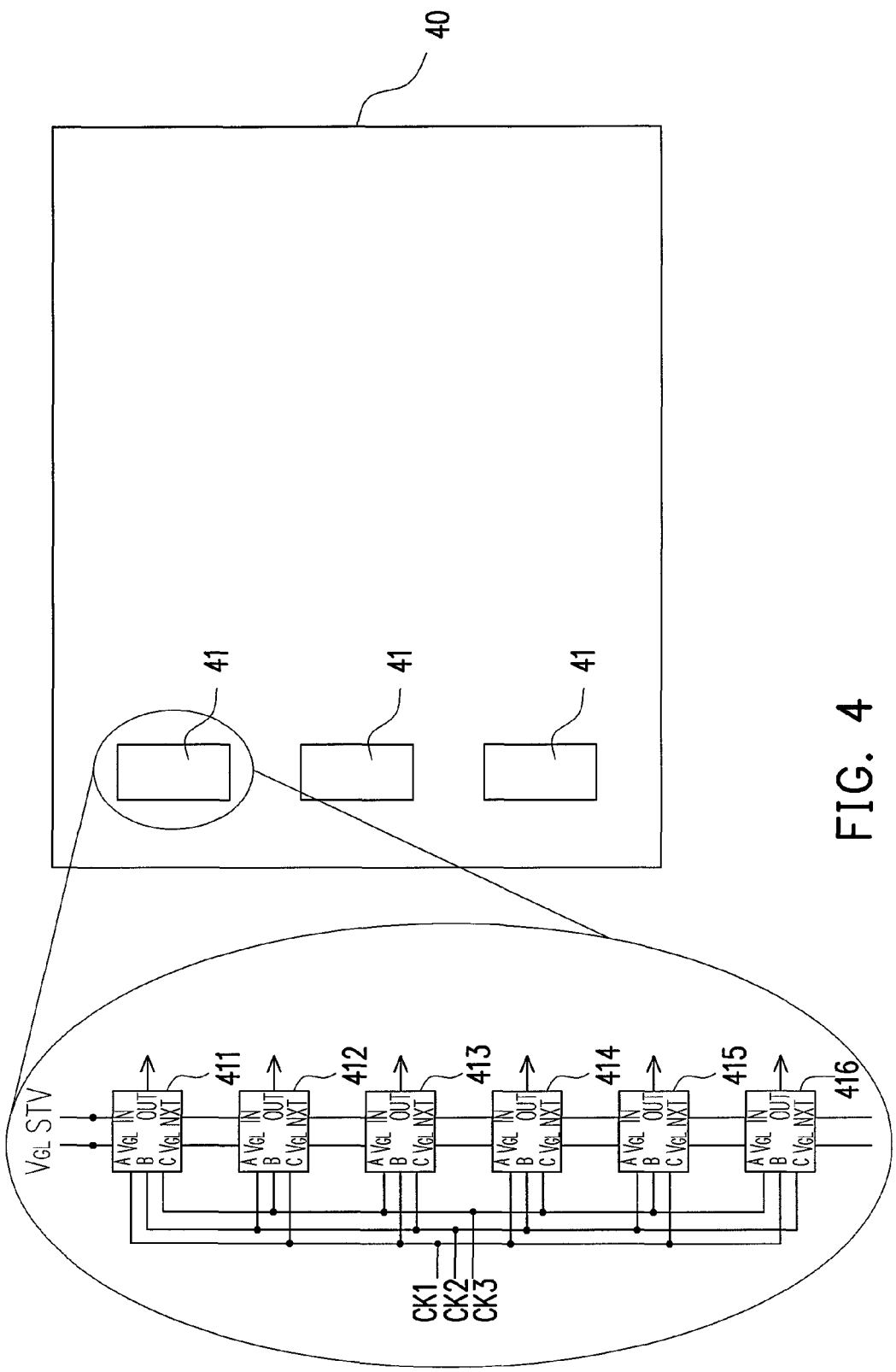
FIG. 4 is a system block diagram of a liquid crystal display (LCD) according to an embodiment of the present invention.

FIG. 4 is a system block diagram of a liquid crystal display (LCD) according to an embodiment of the present invention. Referring to FIG. 4, the LCD includes an LCD panel 40 and a plurality of display drivers 41. Wherein, the LCD panel 40 is fabricated based on an amorphous silicon (a-Si) process, and each of the display driver 41 includes a plurality of shift registers 411~416 directly disposed on a glass substrate (not shown) of the LCD panel 40.

Figure 5:
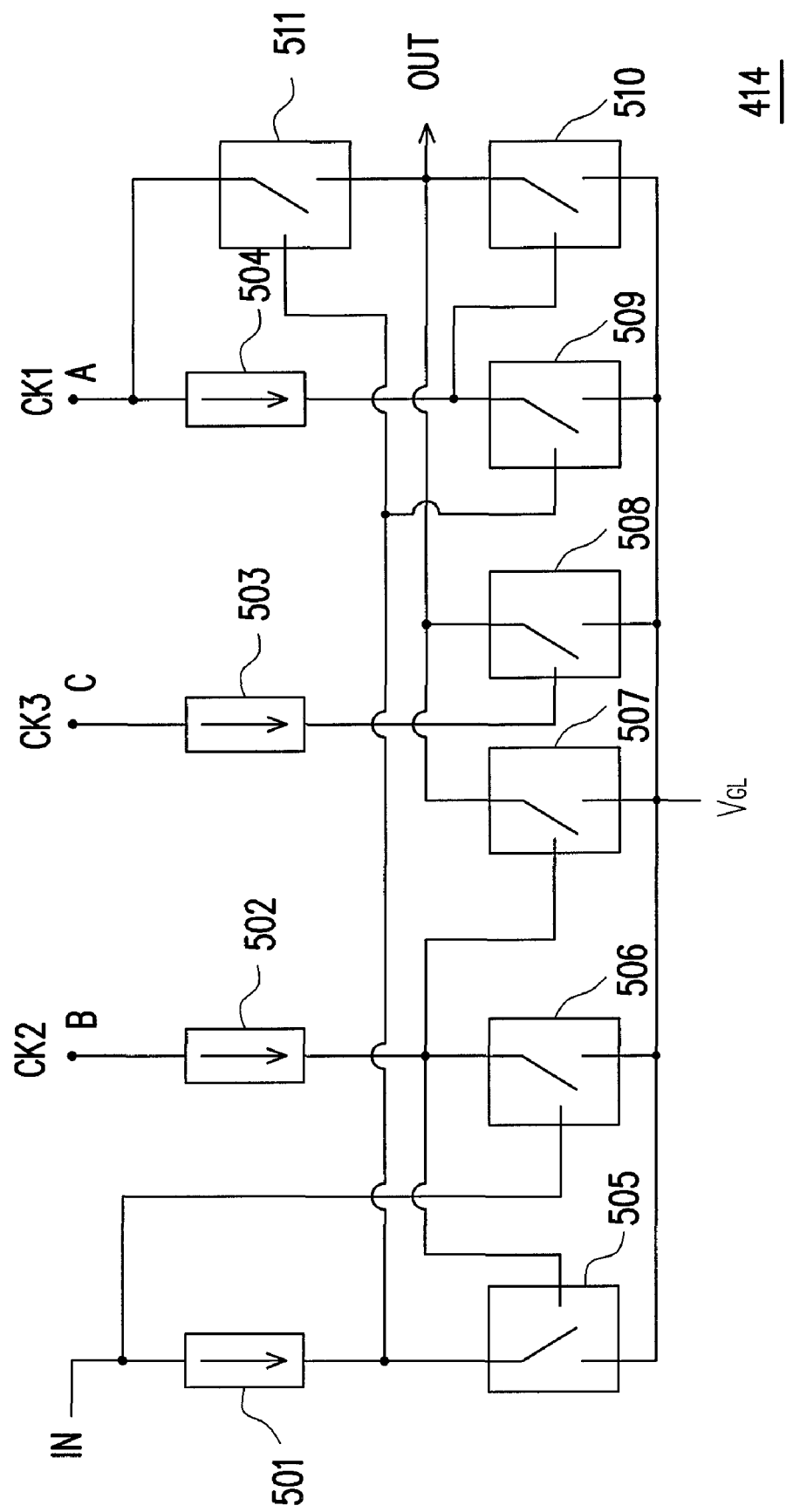
FIG. 5 is a circuit diagram of a shift register 414 of FIG. 4.

FIG. 5 is a circuit diagram of a shift register 414 of FIG. 4. Referring to FIG. 4 and FIG. 5, the shift register 414 includes four unilateral conductive devices 501~504 and seven switches 505~511. Wherein, each of the unilateral conductive devices 501~504 transmits a signal received from a first terminal thereof to a second terminal thereof, and each of the switches 505~511 has a first terminal, a second terminal and a control terminal controlling turning on/off states of the first terminal and the second terminal. For continently describing the present embodiment, nodes A, B, C, and input node IN and an output node OUT are also designated in FIG. 5.

In the present embodiment, the first terminal of the unilateral conductive device 501 is coupled to the control terminal of the switch 506 to function as the input node IN of the shift register 414, and receive an output data from a node NXT of a previous stage shift register 413, wherein the data output from the node NXT of the shift register 413 is the same to that output from the output node OUT of the shift register 413. The second terminals of the switches 505~510 are all coupled to a gate low-level voltage $V_{GL}$. The first terminals (the nodes A, B and C) of the unilateral conductive devices 502, 503, 504 and the switch 511 respectively receive clock signals CK1~CK3. Wherein, a phase difference between the clock signal CK1 and the clock signal CK2 is 120 degrees, a phase difference between the clock signal CK2 and the clock signal CK3 is 120 degrees, and difference between the clock signal CK1 and the clock signal CK3 is 240 degrees.

Moreover, the second terminal of the unilateral conductive device 501 is coupled to the control terminals of the switches 509 and 511, and is coupled to the first terminal of the switch 505. The second terminal of the unilateral conductive device 502 is coupled to the control terminals of the switches 505 and 507, and is coupled to the first terminal of the switch 506. The second terminal of the unilateral conductive device 503 is coupled to the control terminal of the switch 508. The second terminal of the unilateral conductive device 504 is coupled to the first terminal of the switch 509 and the control terminal of the switch 510. The first terminals of the switch 507, 508 and 510 are coupled to the second terminal of the switch 511.

Figure 1:
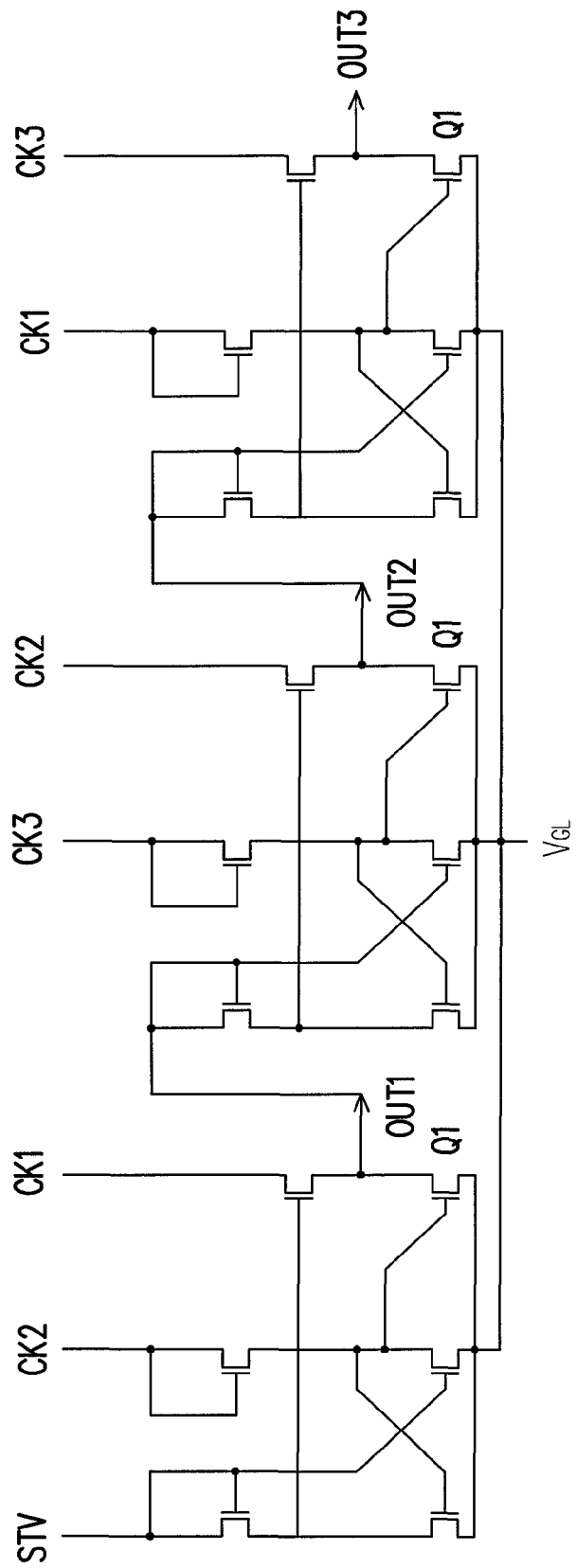
FIG. 1 is a circuit diagram illustrating a conventional 3-stage shift register directly fabricated on a glass substrate.
Figure 2:
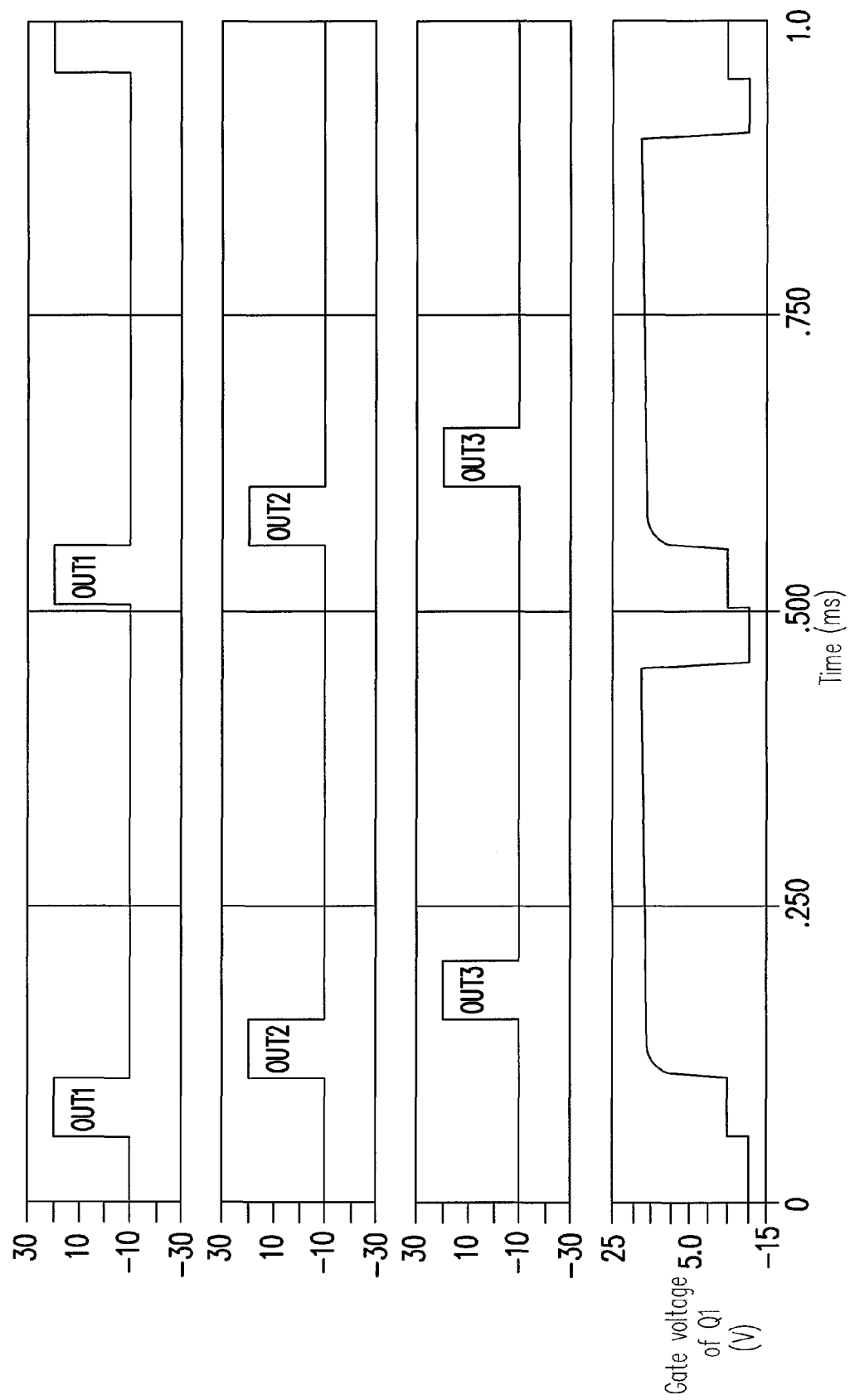
FIG. 2 is a diagram illustrating operation timings and voltage simulations of a 3-stage shift register of FIG. 1.
Figure 3:
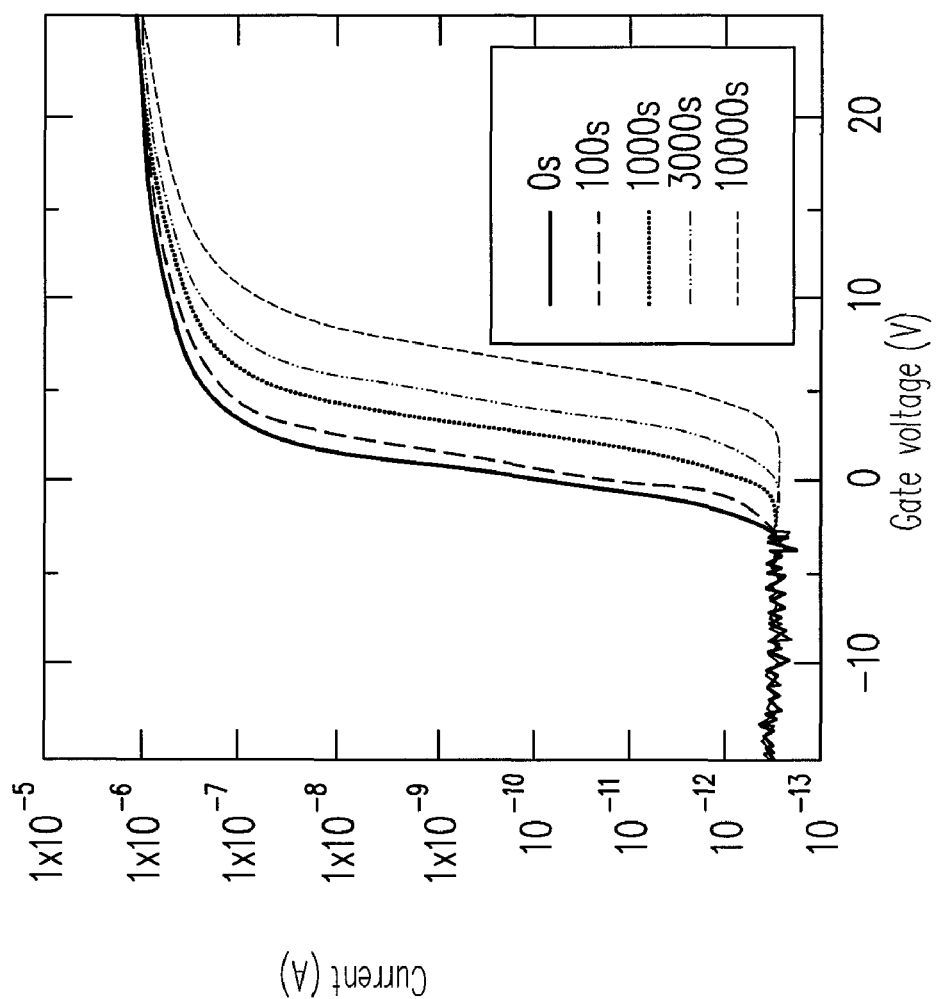
FIG. 3 is a diagram illustrating current-voltage curves of a thin-film transistor when a gate thereof is under a high voltage.
Figure 6:
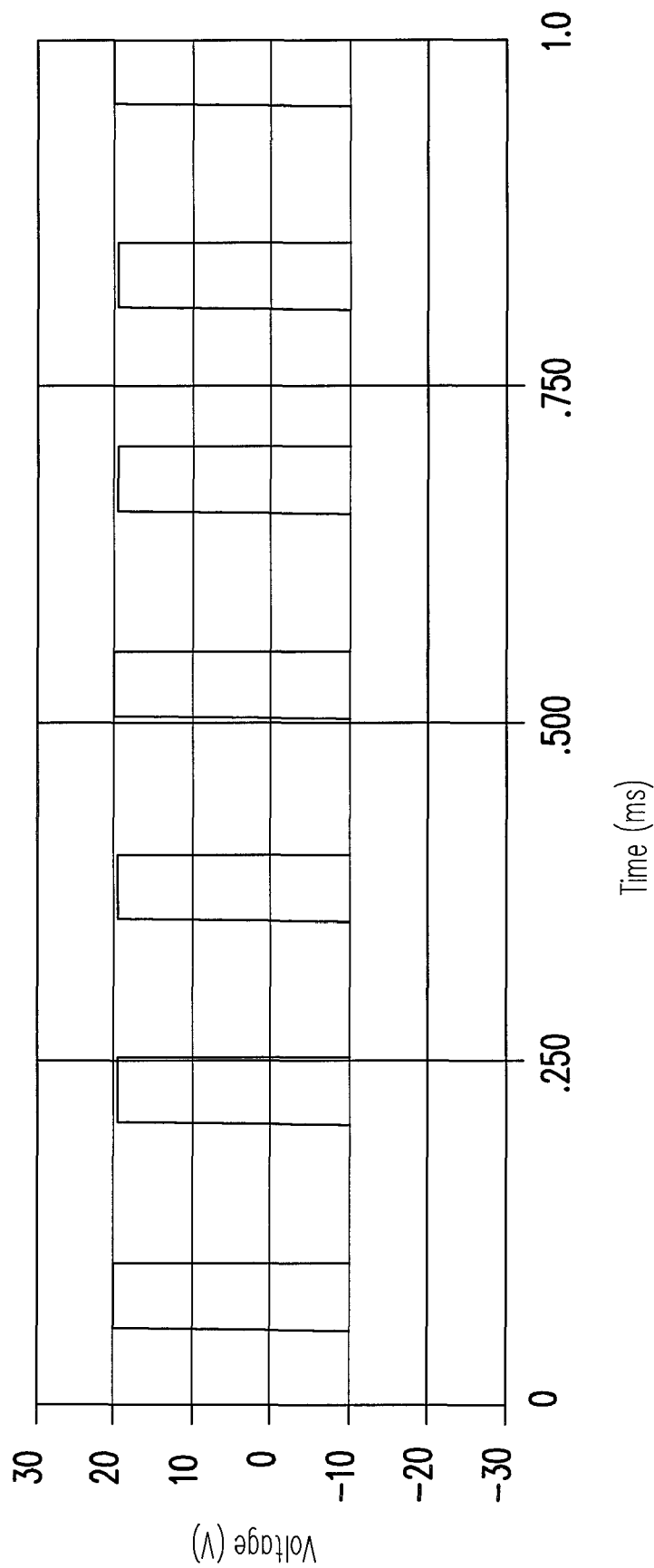
FIG. 6 is a waveform diagram of a voltage received by a control terminal of a switch 510 within a shift register 414 of FIG. 5.

FIG. 6 is a waveform diagram of a voltage received by a control terminal of a switch 510 within a shift register 414 of FIG. 5. According to FIG. 6, it is obvious that the voltage received by the control terminal of the switch 510 within the shift register 414 may be varied according to the clock signal CK1, and therefore the stress taken by the switch 510 is far more less than that taken by a transistor Q1 of FIG. 1 of a conventional technique. Moreover, error of data output from the output node OUT may be avoided under control of the switches 507 and 508, and the clock signals CK2 and CK3.

The nodes A, B and C of the shift registers 411~416 respectively receive the clock signals CK1~CK3. In actual applications, utilization of the shift registers 411~416 are in accordance with certain rules. In the above embodiment, the shift register 414 is taken as an example. If the shift register 414 is substituted by the shift register 413, the node A then receives the clock signal CK3, the node B receives the clock signal CK1, and the node C receives the clock signal CK2. If the shift register 414 is substituted by the shift register 412, the node A then receives the clock signal CK2, the node B receives the clock signal CK3, and the node C receives the clock signal CK1.

Therefore, the above rules may be concluded as: the node B of a (3k+1)-th shift register receives the clock signal CK2, the node C thereof receives the clock signal CK3, and the node A thereof receives the clock signal CK1; the node B of a (3k+2)-th shift register receives the clock signal CK3, the node C thereof receives the clock signal CK1, and the node A thereof receives the clock signal CK2; the node B of a 3k-th shift register receives the clock signal CK1, the node C thereof receives the clock signal CK2, and the node A thereof receives the clock signal CK3, where k is a natural number.

Moreover, it should be mentioned that though a possible pattern of the shift register, the display driver, the LCD panel and the LCD has been described in the above embodiment, it should be understood by those skilled in the art that the design of the unilateral conductive devices and the switches varies with manufacturers, thus, application of the present invention should not be limited to the possible pattern. In other words, the spirit of the present invention is met as long as functions and coupling relations of the devices are as that described above.

Figure 7:
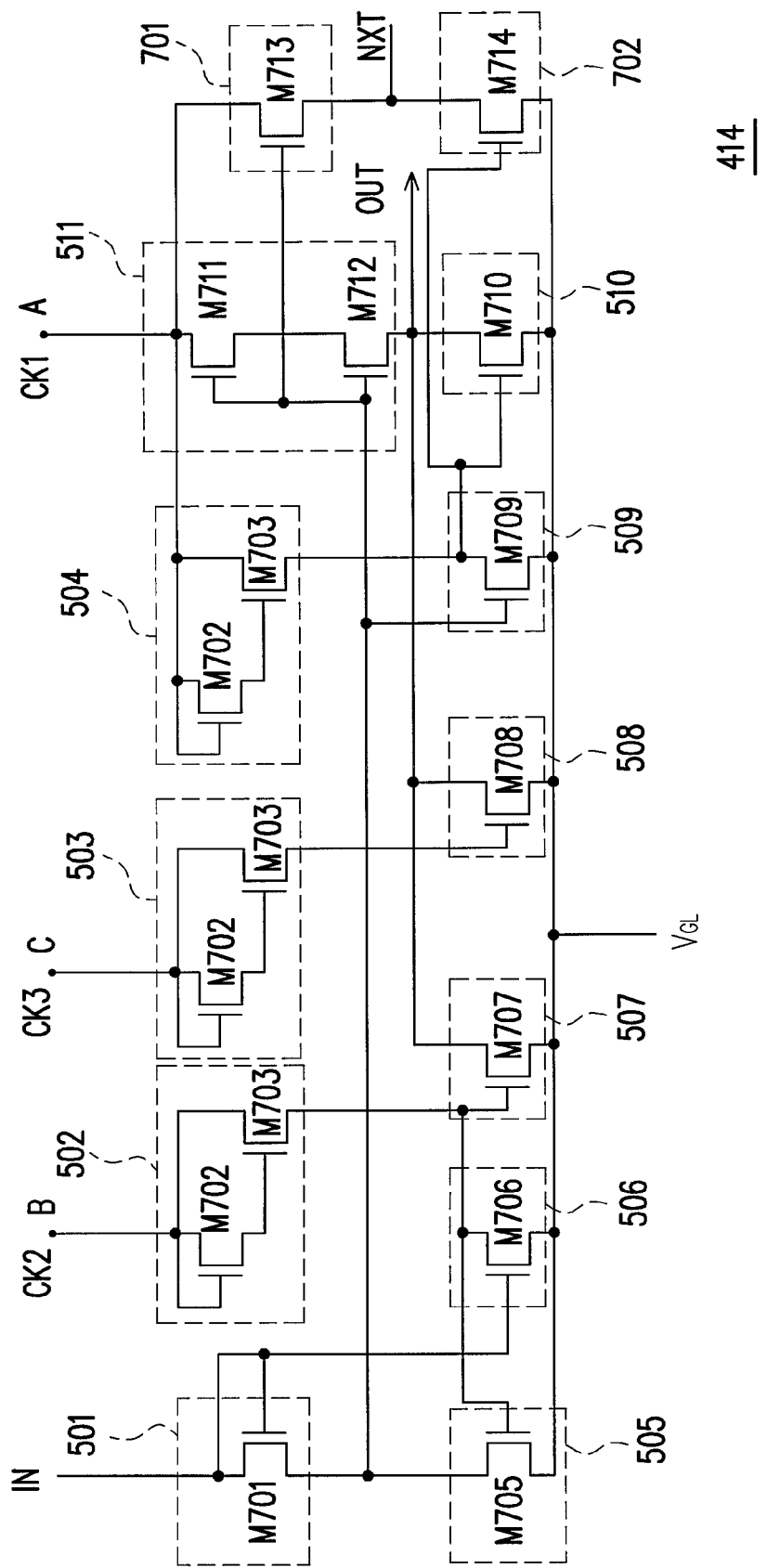
FIG. 7 is a further circuit diagram of a shift register 414 of FIG. 5.

FIG. 7 is a further circuit diagram of a shift register 414 of FIG. 5. Referring to FIG. 5 and FIG. 7, in the present embodiment, the unilateral conductive device 501 is embodied by an N-type transistor M701 connected as a diode, namely, a gate of the N-type transistor M701 is coupled to a first source/drain thereof and functions as a first terminal of the unilateral conductive device 501, and a second source/drain of the N-type transistor M701 functions as a second terminal of the unilateral conductive device 501.

The unilateral conductive devices 502~504 are respectively embodied by a first N-type transistor M702 and a second N-type transistor M703. A gate of the first N-type transistor M702 is coupled to a first source/drain thereof, a gate of the second N-type transistor M703 is coupled to a second source/drain of the first N-type transistor M702, and a first source/drain of the second N-type transistor M703 is coupled to the first source/drain of the first N-type transistor M702. Wherein, the gates and the first sources/drains of the first N-type transistors M702 and the first sources/drains of the second N-type transistors M703 function as the first terminals of the unilateral conductive devices 502~504, and the second sources/drains of the second N-type transistors M703 function as the second terminals of the unilateral conductive devices 502~504.

Moreover, the switches 505~510 are embodied by the N-type transistors M705~M710. Wherein, gates of the N-type transistors M705~M710 respectively function as control terminals of the switches 505~710, first sources/drains of the N-type transistors M705~M710 respectively function as first terminals of the switches 505~510, and second sources/drains of the N-type transistors M705~M710 respectively function as second terminals of the switches 505~510.

In addition, the switch 511 is embodied by two serially connected N-type transistors M711 and M712 with gates thereof coupled with each other. Wherein, the gate of the N-type transistor M712 is coupled to the gate of the N-type transistor M711, and a first source/drain of the N-type transistor M712 is coupled to a second source/drain of the N-type transistor M711. Wherein, a second source/drain of the N-type transistor M712 functions as the second terminal of the switch 511, the gates of the N-type transistors M711 and M712 function as the control terminal of the switch 511, and the first source/drain of the N-type transistor M711 functions as the first terminal of the switch 511. In the present embodiment, by applying the serially connected N-type transistors M711 and M712, the switch 511 may adjust a bias of the output node OUT.

Moreover, two more switches 701 and 702 are applied to the present embodiment, and the two switches 701 and 702 are respectively embodied by N-type transistors M713 and M714. Wherein, a gate of the N-type transistor M713 is coupled to the gates of the N-type transistors M711 and M712, and functions as a control terminal of the switch 701. A gate of the N-type transistor M714 is coupled to the gate of the N-type transistor M710, and functions as a control terminal of the switch 702. A second source/drain of the N-type transistor M714 is coupled to the gate low-level voltage $V_{GL}$, and functions as a second terminal of the switch 702. A first source/drain of the transistor M714 and a second source/drain of the transistor M713 are coupled to the node NXT of the shift register 414, and respectively function as a first terminal and a second terminal of the switches 702 and 701. A first source/drain of the N-type transistor M713 receives the clock signal CK1 and functions as a first terminal of the switch 701.

In the present embodiment, the first terminal of the unilateral conductive device 501 of an (i+1)-th shift register within each of the display drivers 41 is coupled to the second terminal of the switch 701 of an i-th shift register, where i is a natural number. Therefore, the node NXT of the shift register 414 may be coupled to the input node IN of the next stage shift register 415. Moreover, the N-type transistors M713 and M714 are mainly used for equalling the data output from the node NXT of the shift register 414 to the data output from the output node OUT of the shift register 414, so as to share a burden of the N-type transistors M710~M712.

Though the N-type transistors are applied in the above embodiments, those skilled in the art would understand that such design mainly intends to match a fabrication method of the LCD panel which is fabricated based on the amorphous silicon. Therefore, all the switches and the unilateral conductive devices of the shift registers within the display driver 41 are required to be the N-type transistors. However, if the fabrication method of the LCD panel is changed to be based on the poly silicon process, all the switches and the unilateral conductive devices of the shift registers within the display driver 41 then may also be the P-type transistors or complementary (NP mixed) transistors. Therefore, claims of the present invention are not limited by the aforementioned embodiments.

In summary, according to the coupling relations of the aforementioned devices within the shift register and the corresponding received signals, the shift register provided by the present invention may reduce a stress taken by the output stage transistor (i.e. the N-type transistor M710) thereof, so as to improve a reliability of the shift register. Therefore, erroneous actions of the shift register may be avoided during long time operation thereof.

Moreover, since the LCD panel provided by the present invention is fabricated based on the amorphous silicon or the poly silicon process, the display driver may not only be easily disposed on the glass substrate of the LCD panel, but may also replace a utilization of the conventional scan driver. Accordingly, fabrication cost of the LCD provided by the present invention may be reduced while application of the scan driver is omitted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register, comprising:
   a first unilateral conductive device, with signals being transmitted from a first terminal thereof to a second terminal thereof;
   a second unilateral conductive device, with signals being transmitted from a first terminal thereof to a second terminal thereof;
   a third unilateral conductive device, with signals being transmitted from a first terminal thereof to a second terminal thereof;
   a fourth unilateral conductive device, with signals being transmitted from a first terminal thereof to a second terminal thereof;
   a first switch, having a first terminal, a second terminal and a control terminal, wherein the first terminal of the first switch is coupled to the second terminal of the first unilateral conductive device, and the second terminal of the first switch receives a gate low-level voltage;
   a second switch, having a first terminal, a second terminal and a control terminal, wherein the first terminal of the second switch is coupled to the control terminal of the first switch and the second terminal of the second unilateral conductive device, the second terminal of the second switch receives the gate low-level voltage, and the control terminal of the second switch is coupled to the first terminal of the first unilateral conductive device;
   a third switch, having a first terminal, a second terminal and a control terminal, wherein the second terminal of the third switch receives the gate low-level voltage, and the control terminal of the third switch is coupled to the second terminal of the second unilateral conductive device;
   a fourth switch, having a first terminal, a second terminal and a control terminal, wherein the first terminal of the fourth switch is coupled to the first terminal of the third switch, the second terminal of the fourth switch receives the gate low-level voltage, and the control terminal of the fourth switch is coupled to the second terminal of the third unilateral conductive device;
   a fifth switch, having a first terminal, a second terminal and a control terminal, wherein the first terminal of the fifth switch is coupled to the second terminal of the fourth unilateral conductive device, the second terminal of the fifth switch receives the gate low-level voltage, and the control terminal of the fifth switch is coupled to the second terminal of the first unilateral conductive device;
   a sixth switch, having a first terminal, a second terminal and a control terminal, wherein the second terminal of the sixth switch receives the gate low-level voltage, and the control terminal of the sixth switch is coupled to the first terminal of the fifth switch; and
   a seventh switch, having a first terminal, a second terminal and a control terminal, wherein the control terminal of the seventh switch is coupled to the second terminal of the first unilateral conductive device, the first terminal of the seventh switch is coupled to the first terminal of the fourth unilateral conductive device, and the second terminal of the seventh switch is coupled to the first terminal of the sixth switch.

2. The shift register as claimed in claim 1, further comprising:
   an eighth switch, having a first terminal, a second terminal and a control terminal, wherein the first terminal of the eighth switch is coupled to the first terminal of the seventh switch, and the control terminal of the eighth switch is coupled to the control terminal of the seventh switch; and
   a ninth switch, having a first terminal, a second terminal and a control terminal, wherein the first terminal of the ninth switch is coupled to the second terminal of the eighth switch, the second terminal of the ninth switch receives the gate low-level voltage, and the control terminal of the ninth switch is coupled to the control terminal of the sixth switch.

3. The shift register as claimed in claim 1, wherein the first unilateral conductive device comprises an N-type transistor having a gate coupled to a first source/drain thereof, and functions as the first terminal of the first unilateral conductive device, and a second source/drain thereof functions as the second terminal of the first unilateral conductive device.

4. The shift register as claimed in claim 1, wherein the second to the fourth unilateral conductive devices respectively comprises:
   a first N-type transistor, having a gate coupled to a first source/drain thereof; and
   a second N-type transistor, having a gate coupled to a second source/drain of the first N-type transistor, and a first source/drain thereof coupled to the first source/drain of the first N-type transistor, wherein the gates and the first sources/drains of the first N-type transistors and the first sources/drains of the second N-type transistors function as the first terminals of the second to the fourth unilateral conductive devices, and the second sources/drains of the second N-type transistors function as the second terminals of the second to the fourth unilateral conductive devices.

5. The shift register as claimed in claim 1, wherein the seventh switch comprises:
   a first N-type transistor; and
   a second N-type transistor, having a gate coupled to a gate of the first N-type transistor, a first source/drain thereof coupled to a second source/drain of the first N-type transistor, wherein a second source/drain of the second N-type transistor functions as the second terminal of the seventh switch, the gates of the first and the second N-type transistors function as the control terminal of the seventh switch, and a first source/drain of the first N-type transistor functions as the first terminal of the seventh switch.

6. The shift register as claimed in claim 1, wherein the first to the sixth switches are N-type transistors having gates thereof function as the control terminals of the first to the sixth switches, first sources/drains thereof function as the first terminals of the first to the sixth switches, and second sources/drains thereof function as the second terminals of the first to the sixth switches.

7. A display driver, comprising:
   a plurality of serially connected shift registers, wherein each of the shift registers comprises:
      a first unilateral conductive device, with signals being transmitted from a first terminal thereof to a second terminal thereof;
      a second unilateral conductive device, with signals being transmitted from a first terminal thereof to a second terminal thereof;
      a third unilateral conductive device, with signals being transmitted from a first terminal thereof to a second terminal thereof;

a fourth unilateral conductive device, with signals being transmitted from a first terminal thereof to a second terminal thereof;

a first switch, having a first terminal, a second terminal and a control terminal, wherein the first terminal of the first switch is coupled to the second terminal of the first unilateral conductive device, and the second terminal of the first switch receives a gate low-level voltage;

a second switch, having a first terminal, a second terminal and a control terminal, wherein the first terminal of the second switch is coupled to the control terminal of the first switch and the second terminal of the second unilateral conductive device, the second terminal of the second switch receives the gate low-level voltage, and the control terminal of the second switch is coupled to the first terminal of the first unilateral conductive device;

a third switch, having a first terminal, a second terminal and a control terminal, wherein the second terminal of the third switch receives the gate low-level voltage, and the control terminal of the third switch is coupled to the second terminal of the second unilateral conductive device;

a fourth switch, having a first terminal, a second terminal and a control terminal, wherein the first terminal of the fourth switch is coupled to the first terminal of the third switch, the second terminal of the fourth switch receives the gate low-level voltage, and the control terminal of the fourth switch is coupled to the second terminal of the third unilateral conductive device;

a fifth switch, having a first terminal, a second terminal and a control terminal, wherein the first terminal of the fifth switch is coupled to the second terminal of the fourth unilateral conductive device, the second terminal of the fifth switch receives the gate low-level voltage, and the control terminal of the fifth switch is coupled to the second terminal of the first unilateral conductive device;

a sixth switch, having a first terminal, a second terminal and a control terminal, wherein the second terminal of the sixth switch receives the gate low-level voltage, and the control terminal of the sixth switch is coupled to the first terminal of the fifth switch; and a seventh switch, having a first terminal, a second terminal and a control terminal, wherein the control terminal of the seventh switch is coupled to the second terminal of the first unilateral conductive device, the first terminal of the seventh switch is coupled to the first terminal of the fourth unilateral conductive device, and the second terminal of the seventh switch is coupled to the first terminal of the sixth switch.

8. The display driver as claimed in claim 7, wherein each of the shift registers further comprises:

an eighth switch, having a first terminal, a second terminal and a control terminal, wherein the first terminal of the eighth switch is coupled to the first terminal of the seventh switch, and the control terminal of the eighth switch is coupled to the control terminal of the seventh switch; and a ninth switch, having a first terminal, a second terminal and a control terminal, wherein the first terminal of the ninth switch is coupled to the second terminal of the eighth switch, the second terminal of the ninth switch receives the gate low-level voltage, and the control terminal of the ninth switch is coupled to the control terminal of the sixth switch.

9. The display driver as claimed in claim 7, wherein the first unilateral conductive device comprises an N-type transistor having a gate coupled to a first source/drain thereof, and functions as the first terminal of the first unilateral conductive device, and a second source/drain thereof functions as the second terminal of the first unilateral conductive device.

10. The display driver as claimed in claim 7, wherein the second to the fourth unilateral conductive devices respectively comprises:

a first N-type transistor, having a gate coupled to a first source/drain thereof; and a second N-type transistor, having a gate coupled to a second source/drain of the first N-type transistor, and a first source/drain thereof coupled to the first source/drain of the first N-type transistor, wherein the gates and the first sources/drains of the first N-type transistors and the first sources/drains of the second N-type transistors function as the first terminals of the second to the fourth unilateral conductive devices, and the second sources/drains of the second N-type transistors function as the second terminals of the second to the fourth unilateral conductive devices.

11. The display driver as claimed in claim 7, wherein the seventh switch comprises:

a first N-type transistor; and a second N-type transistor, having a gate coupled to a gate of the first N-type transistor, a first source/drain thereof coupled to a second source/drain of the first N-type transistor, wherein a second source/drain of the second N-type transistor functions as the second terminal of the seventh switch, the gates of the first and the second N-type transistors function as the control terminal of the seventh switch, and a first source/drain of the first N-type transistor functions as the first terminal of the seventh switch.

12. The display driver as claimed in claim 7, wherein the first to the sixth switches are N-type transistors having gates thereof function as the control terminals of the first to the sixth switches, first sources/drains thereof function as the first terminals of the first to the sixth switches, and second sources/drains thereof function as the second terminals of the first to the sixth switches.

13. The display driver as claimed in claim 8, wherein the first terminal of the first unilateral conductive device of an (i+1)-th shift register is coupled to the second terminal of the eighth switch of an i-th shift register, wherein i is a natural number.

14. The display driver as claimed in claim 7, wherein each of the shift registers respectively receives a first, a second and a third clock signals, the first terminal of the second unilateral conductive device of a (3k+1)-th shift register receives the second clock signal, the first terminal of the third unilateral conductive device of the (3k+1)-th shift register receives the third clock signal, the first terminal of the fourth unilateral conductive device of the (3k+1)-th shift register receives the first clock signal, the first terminal of the second unilateral conductive device of a (3k+2)-th shift register receives the third clock signal, the first terminal of the third unilateral conductive device of the (3k+2)-th shift register receives the first clock signal, the first terminal of the fourth unilateral conductive device of the (3k+2)-th shift register receives the second clock signal, the first terminal of the second unilateral conductive device of a 3k-th shift register receives the first clock signal, the first terminal of the third unilateral conductive device of the 3k-th shift register receives the second clock signal, the first terminal of the fourth unilateral conductive device of the 3k-th shift register receives the third clock signal;
  wherein a phase difference between the first clock signal and second clock signal is 120 degrees, a phase difference between the second clock signal and the third clock signal is 120 degrees, and a phase difference between the first clock signal and the third clock signal is 240 degrees, where k is a natural number.

15. A liquid crystal display (LCD) panel, wherein the display driver as claimed in claim 8 is directly disposed on a glass substrate of the LCD panel, and the LCD panel is fabricated based on an amorphous silicon or a poly silicon process.

16. An LCD having the LCD panel as claimed in claim 15.

* * * * *